US 11,848,177 B2

(12) United States Patent
Wang et al.

(10) Patent No.: US 11,848,177 B2
(45) Date of Patent: Dec. 19, 2023

(54) MULTI-PLATE ELECTROSTATIC CHUCKS WITH CERAMIC BASEPLATES

(71) Applicant: LAM RESEARCH CORPORATION, Fremont, CA (US)

(72) Inventors: Feng Wang, Sunnyvale, CA (US); Keith Gaff, Fremont, CA (US); Christopher Kimball, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 865 days.

(21) Appl. No.: 15/903,682

(22) Filed: Feb. 23, 2018

(65) Prior Publication Data

US 2019/0267218 A1    Aug. 29, 2019

(51) Int. Cl.
*H01L 21/683*   (2006.01)
*H01L 21/67*    (2006.01)
*H01J 37/32*    (2006.01)
*H01J 37/244*   (2006.01)
*H01L 21/687*   (2006.01)

(52) U.S. Cl.
CPC ...... *H01J 37/32715* (2013.01); *H01J 37/244* (2013.01); *H01J 37/3244* (2013.01); *H01J 37/32082* (2013.01); *H01J 37/32522* (2013.01); *H01J 37/32568* (2013.01); *H01L 21/67103* (2013.01); *H01L 21/67109* (2013.01); *H01L 21/67248* (2013.01); *H01L 21/6831* (2013.01); *H01L 21/6833* (2013.01); *H01J 2237/002* (2013.01); *H01J 2237/3321* (2013.01); *H01L 21/68742* (2013.01)

(58) Field of Classification Search
None
See application file for complete search history.

(56) References Cited

U.S. PATENT DOCUMENTS

| 4,859,520 | A | 8/1989 | Dubuisson et al. |
| 5,701,228 | A | 12/1997 | Ishii |
| 10,347,521 | B2 | 7/2019 | Ishikawa et al. |
| 2002/0186967 | A1* | 12/2002 | Ramanan .......... H01L 21/67103 392/418 |
| 2004/0154540 | A1* | 8/2004 | Hayami ............ H01J 37/32082 118/723 E |

(Continued)

FOREIGN PATENT DOCUMENTS

| JP | 2001118915 A | 4/2001 |
| JP | 2003208966 A | 7/2003 |

(Continued)

OTHER PUBLICATIONS

International Search Report and Written Opinion for PCT/US2019/018190 filed Feb. 15, 2019; 10 pages.

(Continued)

*Primary Examiner* — Jeffrie R Lund
*Assistant Examiner* — Tiffany Z Nuckols

(57) ABSTRACT

An electrostatic chuck for a substrate processing system is provided. The electrostatic chuck includes: a top plate configured to electrostatically clamp to a substrate and formed of ceramic; an intermediate layer disposed below the top plate; and a baseplate disposed below the intermediate layer and formed of ceramic. The intermediate layer bonds the top plate to the baseplate.

45 Claims, 9 Drawing Sheets

(56) References Cited

U.S. PATENT DOCUMENTS

| | | | |
|---|---|---|---|
| 2004/0192053 A1* | 9/2004 | Fujimoto | H01L 21/31116 438/697 |
| 2005/0118450 A1* | 6/2005 | Fujii | B23K 35/286 428/621 |
| 2006/0076109 A1 | 4/2006 | Holland et al. | |
| 2006/0285270 A1* | 12/2006 | Lee | H01L 21/67109 361/234 |
| 2009/0071938 A1* | 3/2009 | Dhindsa | H01J 37/32568 216/67 |
| 2010/0078129 A1* | 4/2010 | Himori | H01L 21/6833 156/345.43 |
| 2011/0096461 A1* | 4/2011 | Yoshikawa | H01L 21/6833 361/234 |
| 2011/0154843 A1* | 6/2011 | Ko | H01L 21/6831 62/259.2 |
| 2013/0244405 A1* | 9/2013 | Terahara | H01L 21/32137 438/466 |
| 2013/0286533 A1* | 10/2013 | Takasaki | H01L 21/6831 361/234 |
| 2014/0069584 A1* | 3/2014 | Yang | H01J 37/32935 156/345.44 |
| 2014/0159325 A1 | 6/2014 | Parkhe et al. | |
| 2014/0202386 A1* | 7/2014 | Taga | C23C 4/08 118/723 R |
| 2014/0202389 A1* | 7/2014 | Heo | C30B 29/36 118/726 |
| 2016/0035610 A1* | 2/2016 | Park | H01J 37/32715 156/345.29 |
| 2016/0111314 A1* | 4/2016 | Kimball | H01J 37/32568 438/758 |
| 2016/0126125 A1* | 5/2016 | Okugawa | H01L 21/67103 219/444.1 |
| 2017/0032935 A1* | 2/2017 | Benjamin | H01L 22/26 |
| 2017/0110356 A1 | 4/2017 | Matyushkin et al. | |
| 2017/0200588 A1* | 7/2017 | Joubert | H01J 37/32504 |
| 2017/0256431 A1 | 9/2017 | Parkhe | |
| 2018/0012784 A1* | 1/2018 | Eto | H01J 37/3244 |
| 2018/0019148 A1 | 1/2018 | Cox | |
| 2019/0088517 A1* | 3/2019 | Kosakai | H01L 21/67103 |
| 2020/0194240 A1* | 6/2020 | Sasaki | H01J 37/32577 |

FOREIGN PATENT DOCUMENTS

| | | | |
|---|---|---|---|
| JP | 2005012143 A | 1/2005 | |
| JP | 3887842 B2 | 2/2007 | |
| JP | 2007266342 A | 10/2007 | |
| JP | 2010114351 A | 5/2010 | |
| JP | 2014160790 A | 9/2014 | |
| JP | 5714119 B2 | 5/2015 | |
| JP | 2015159232 A | 9/2015 | |
| JP | 2015226010 A | 12/2015 | |
| JP | 2016503962 A | 2/2016 | |
| JP | 2017076580 A | 4/2017 | |
| JP | 2017208565 A | 11/2017 | |
| JP | 2019117928 A | 7/2019 | |
| KR | 101495850 B1 | 2/2015 | |
| WO | WO-2014084334 A1 | 6/2014 | |
| WO | WO-2016080502 A1 * | 5/2016 | H01L 21/67069 |
| WO | WO-2017151238 A1 | 9/2017 | |

OTHER PUBLICATIONS

International Search Report and Written Opinion of the ISA issued in PCT/US2020/015148, dated May 27, 2020; ISA/KR.

International Search Report and Written Opinion for PCT Application No. PCT/US2019/046678 dated Dec. 2, 2019; 11 Pages.

Office Action issued in corresponding Japanese Patent Application 2020-544427 dated Feb. 21, 2023.

* cited by examiner

MULTI-PLATE ELECTROSTATIC CHUCKS WITH CERAMIC BASEPLATES

FIELD

The present disclosure relates to electrostatic chucks of substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a physical vapor deposition (PVD) process, an ion implantation process, and/or other etch, deposition, and cleaning processes. As an example, during an etching process, a substrate may be arranged on an electrostatic chuck (ESC) in a substrate processing system and a thin film on the substrate is etched.

SUMMARY

An electrostatic chuck for a substrate processing system is provided. The electrostatic chuck includes: a top plate configured to electrostatically clamp to a substrate and formed of ceramic; an intermediate layer disposed below the top plate; and a baseplate disposed below the intermediate layer and formed of ceramic. The intermediate layer bonds the top plate to the baseplate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
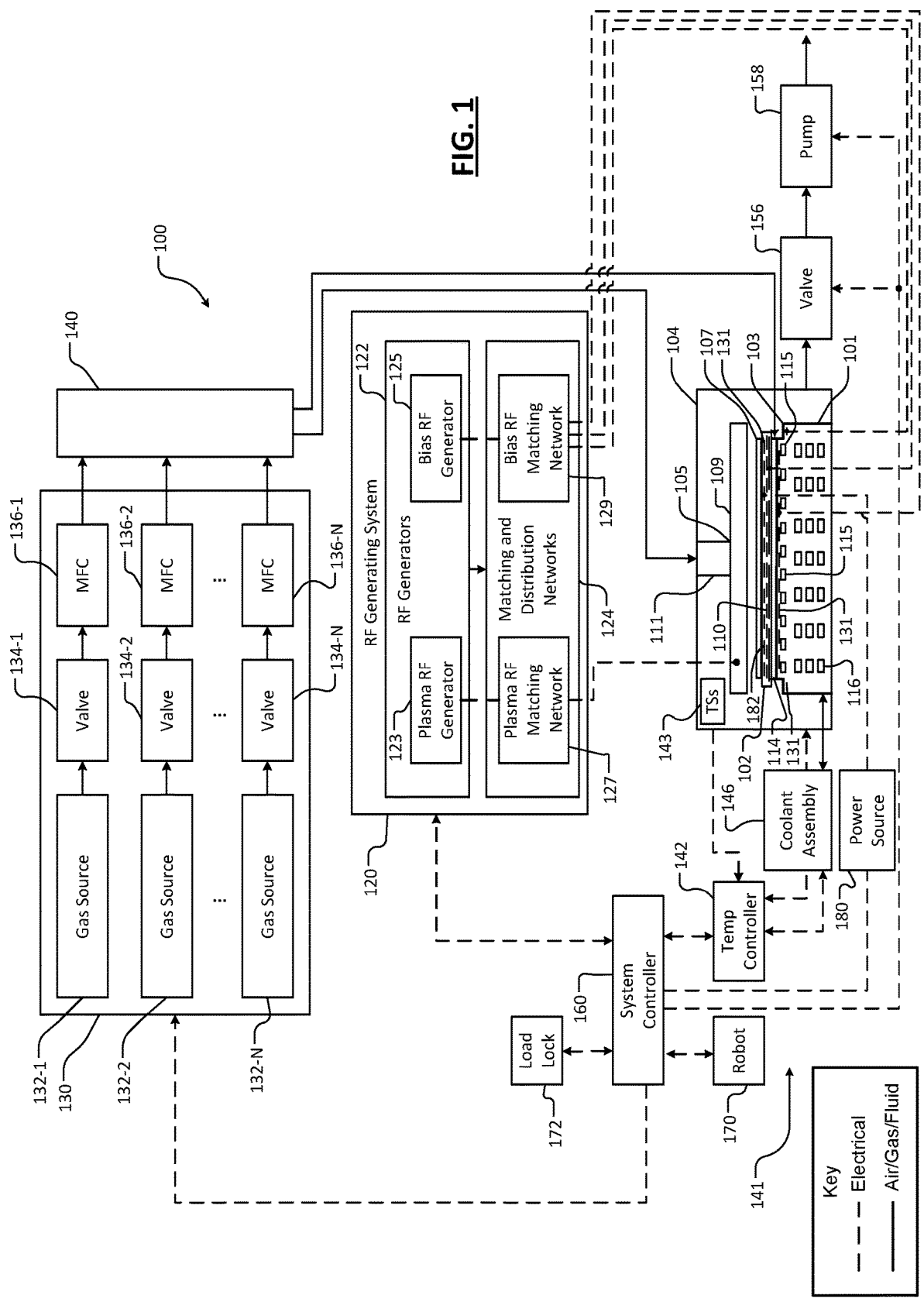
FIG. 1 is a functional block diagram of an example of a substrate processing system incorporating an ESC in accordance with an embodiment of the present disclosure.

An ESC holds a substrate during processing of the substrate. The ESC holds the substrate in place using electrostatic force in, for example, a vacuum processing chamber. In order to electrostatically clamp a substrate on the ESC while cooling the ESC, the ESC may have a two-plate arrangement including a thin top plate formed of a dielectric material and a bulk (or thick) baseplate formed of one or more metals and/or metal composites. Traditionally, the top plate includes an electrostatic electrode and may be formed of precision controlled ceramic (i.e. having a ceramic purity level of greater than or equal to 90%) in order to maintain electric properties of the top plate. It is difficult to manufacture a thick plate of precision controlled ceramic. For this reason, the top plate is typically thin (e.g., 0.25 inches thick). By forming the baseplate of metal or a composite metal material (e.g., a combination of metal and ceramic), the baseplate may be easily and inexpensively manufactured. It is inexpensive to form and/or machine a baseplate out of metal or composite metal materials to include coolant channels. It is also easy to bond metal or composite metal plates together via a brazing process.

A baseplate of an ESC may serve as an electrode and receive RF power. For example, a baseplate may include a base layer formed of aluminum and may be connected to a RF power source from which the baseplate receives RF power. A baseplate is typically coated with, for example, a thin layer of ceramic to provide a protective coating which prevents arcing to the baseplate. The protective coating may be formed of alumina via an electro-chemical anodization process. A thicker coating layer may be formed by thermal spraying process. With ever increasing processing requirements including higher RF voltages, the two-plate arrangement can have multiple problems. Increased RF voltages and ion energy is needed to etch or drill deep holes with high aspect ratios (e.g., 60:1) and/or to create increased plasma density and provide quicker etching performance.

The ceramic coating on the baseplate can break down at high RF voltages, which can cause electrical arcing to the baseplate. The ceramic coating may crack due to differences in coefficients of thermal expansion between the ceramic coating and the base layer of the baseplate, which is formed of metal or a composite metal material. This can cause electrical arcing and limit process operating ranges. Also, since the top plate and the baseplate are formed of different materials, coefficients of thermal expansion are different. As a result, the top plate and the baseplate expand and contract at different rates with changes in temperature. This can result in misalignment between the top plate and the baseplate and thermal stress, especially when experiencing large and/or quick changes in operating temperatures. In addition, since the baseplate is formed of a conductive material (i.e., metal or a composite metal material), the baseplate serves as a single electrode, which limits control of RF voltages laterally across the baseplate.

The examples set forth herein provide ESCs. The ESCs include multi-plate arrangements capable of handling high RF voltages without the above-stated problems. Each of the ESCs includes a top plate and a baseplate, which are both formed of ceramic. By forming both the top plates and the baseplates of ceramic, differences between coefficients of thermal expansion of the top plate and the baseplate are minimized and thus thermal mismatch between the top plate and the baseplate is reduced as compared to traditional ESCs having two-plate arrangements. Also, by minimizing differences in coefficients of thermal expansion, risks of a high-voltage breakdown and/or cracking of a coating layer of the baseplates due to thermal stresses is reduced and/or eliminated as compared to traditional ESCs. As a result, the usable operating temperature ranges of the ESCs are increased.

FIG. 1 a substrate processing system 100 incorporating an ESC 101. The ESC 101 may be configured the same or similarly as any of the ESCs disclosed herein. Although FIG. 1 shows a capacitive coupled plasma (CCP) system, the embodiments disclosed herein are applicable to transformer coupled plasma (TCP) systems, electron cyclotron resonance (ECR) plasma systems, inductively coupled plasma (ICP) systems and/or other systems and plasma sources that include a substrate support. The embodiments are applicable to PVD processes, PECVD processes, chemically enhanced plasma vapor deposition (CEPVD) processes, ion implantation processes, plasma etching processes, and/or other etch, deposition, and cleaning processes.

Figure 2:
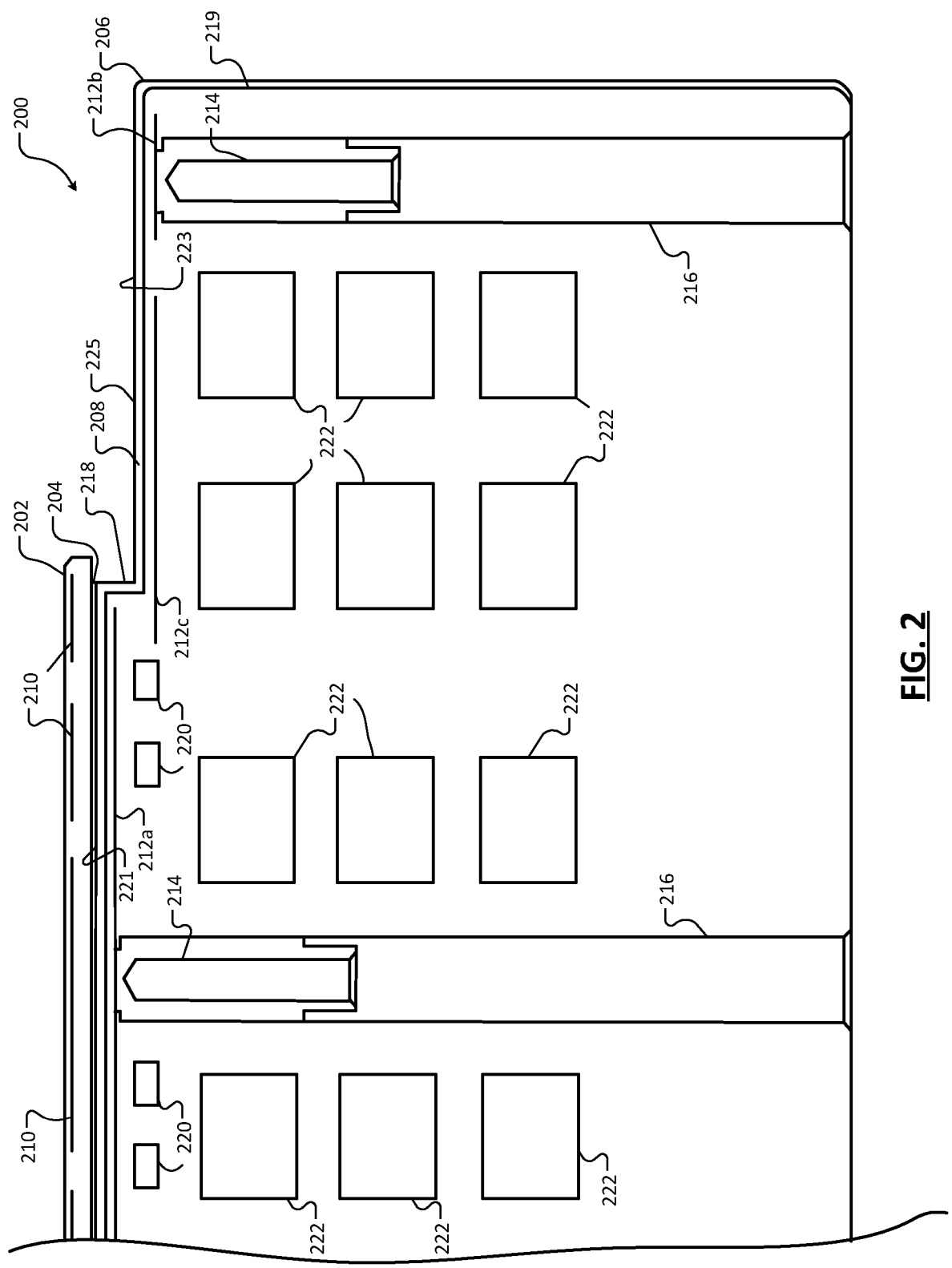
FIG. 2 is a cross-sectional side view of an example of a portion of an ESC incorporating plates, coolant channels, backside gas channels, electrodes, and terminals in accordance with an embodiment of the present disclosure.

The ESC 101 includes a top plate 102 and a baseplate 103. Both of the plates 102, 103 are formed of ceramic and are void of metal. In one embodiment, both of the plates 102, 103 are formed of precisely controlled ceramic (i.e., having a purity level of greater than or equal to 90%). The purity level of the ceramic may vary depending on the application. As an example, a ceramic purity level of the plates 102, 103 may be greater than or equal to 90%. In one embodiment, the ceramic purity level of the plates 102, 103 is greater than or equal to 95%. In another embodiment, the ceramic purity level of the plates 102, 103 is greater than or equal to 99.9%. As further described below, the baseplate 103 may be formed entirely of ceramic or may include a thin protective coating formed of a material other than ceramic. An example of the thin protective coating is shown in FIG. 2. As a few examples, the plates 102, 103 may be formed of alumina (Al2O3), aluminum nitride (AlN), silicon carbide (SiC) and/or other ceramic material. The thin protective coating may be formed of AlN, yttria (Y2O3), zirconia (ZrO2) and/or other suitable materials. The plates 102, 103, other top plates and baseplates, and other features of the disclosed ESCs are further described below with respect to the examples shown in FIGS. 1-10. Although the ESCs of FIGS. 1-10 are each shown as having certain features and not other features, each of the ESCs may be modified to include any of the features disclosed herein and in FIGS. 1-10.

Although the ESC 101 is shown as being mounted to a bottom of a processing chamber and not being configured to be rotated, the ESC 101 and other ESCs disclosed herein may be mounted to a bottom or a top of a processing chamber and may be configured as a spin chuck to be rotated during processing of a substrate. If mounted to a top of a processing chamber, the ESC may have similar configurations to that disclosed herein, but flipped upside down and may include peripheral substrate holding, clamping, and/or clasping hardware.

The substrate processing system 100 includes a processing chamber 104. The ESC 101 is enclosed within the processing chamber 104. The processing chamber 104 also encloses other components, such as an upper electrode 105, and contains RF plasma. During operation, a substrate 107 is arranged on and electrostatically clamped to the top plate 102 of the ESC 101.

For example only, the upper electrode 105 may include a showerhead 109 that introduces and distributes gases. The showerhead 109 may include a stem portion 111 including one end connected to a top surface of the processing chamber 104. The showerhead 109 is generally cylindrical and extends radially outward from an opposite end of the stem portion 111 at a location that is spaced from the top surface of the processing chamber 104. A substrate-facing surface or the showerhead 109 includes holes through which process or purge gas flows. Alternately, the upper electrode 105 may include a conducting plate and the gases may be introduced in another manner. One or both of the plates 102, 103 may perform as a lower electrode.

One or both of the plates 102, 103 may include temperature control elements (TCEs). As an example, FIG. 1 shows the top plate 102 including TCEs 110 and being used as a heating plate. An intermediate layer 114 is arranged between the plates 102, 103. The intermediate layer 114 may bond the top plate 102 to the baseplate 103. As an example, the intermediate layer may be formed of an adhesive material suitable for bonding the top plate 102 to the baseplate 103. The baseplate 103 may include one or more gas channels 115 and/or one or more coolant channels 116 for flowing backside gas to a backside of the substrate 107 and coolant through the baseplate 103.

An RF generating system 120 generates and outputs RF voltages to the upper electrode 105 and the lower electrode (e.g., one or more of the plates 102, 103). One of the upper electrode 105 and the ESC 101 may be DC grounded, AC grounded or at a floating potential. For example only, the RF generating system 120 may include one or more RF generators 122 (e.g., a capacitive coupled plasma RF power generator, a bias RF power generator, and/or other RF power generator) that generate RF voltages, which are fed by one or more matching and distribution networks 124 to the upper electrode 105 and/or the ESC 101. As an example, a plasma RF generator 123, a bias RF generator 125, a plasma RF matching network 127 and a bias RF matching network 129 are shown. The plasma RF generator 123 may be a high-power RF generator producing, for example 6-10 kilo-watts (kW) of power or more. The bias RF matching network supplies power to RF electrodes, such as RF electrodes 131, 133 in the plates 102, 103.

A gas delivery system 130 includes one or more gas sources 132-1, 132-2, . . . , and 132-N (collectively gas sources 132), where N is an integer greater than zero. The gas sources 132 supply one or more precursors and gas mixtures thereof. The gas sources 132 may also supply etch gas, carrier gas and/or purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 104. For example only, the output of the manifold 140 is fed to the showerhead 109.

The substrate processing system 100 further includes a cooling system 141 that includes a temperature controller 142, which may be connected to the TCEs 110. In one embodiment, the TCEs 110 are not included. Although shown separately from a system controller 160, the temperature controller 142 may be implemented as part of the system controller 160. One or more of the plates 102, 103 may include multiple temperature controlled zones (e.g., 4 zones, where each of the zones includes 4 temperature sensors).

Figure 3:
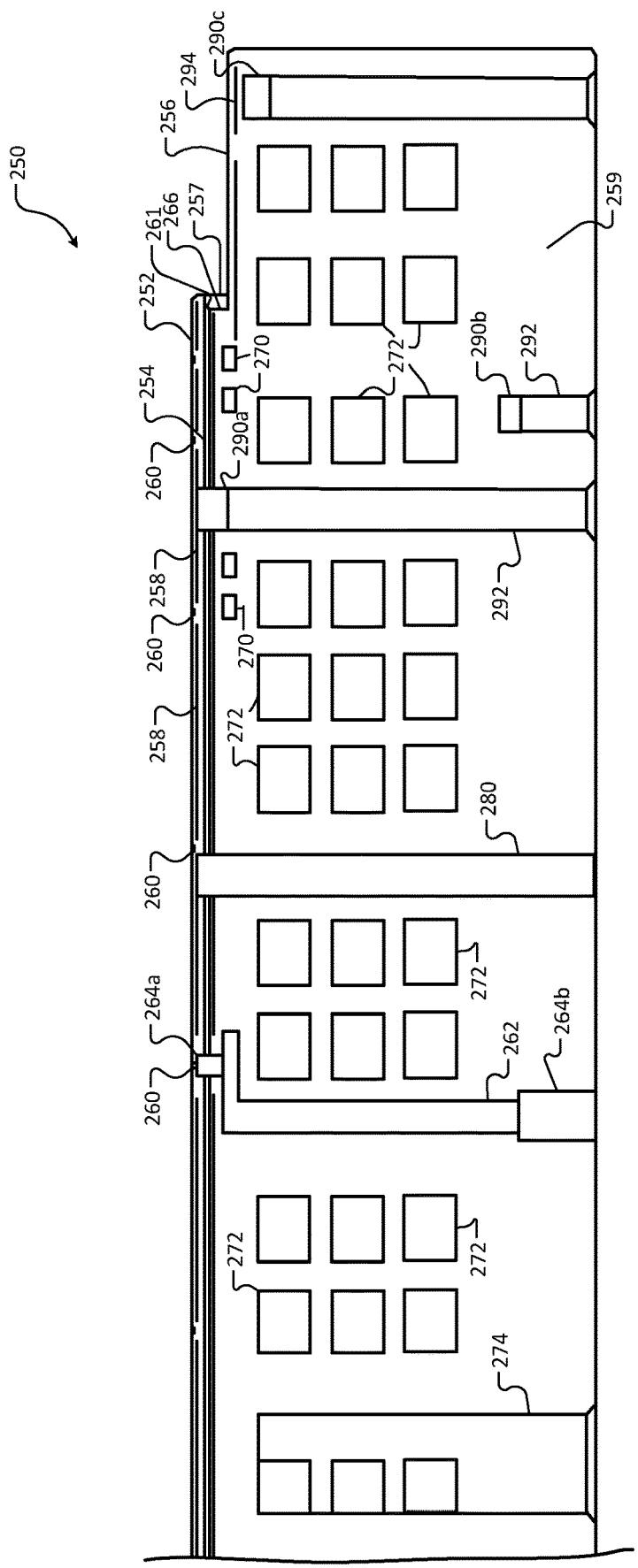
FIG. 3 is a cross-sectional side view of an example of a portion of an ESC incorporating a gas channel with porous plugs, sensors, a seal for an intermediate layer and top protruding arrangement of a baseplate, and an electrostatic terminal in accordance with an embodiment of the present disclosure.

The temperature controller 142 may control operation and thus temperatures of the TCEs 110 to control temperatures of the plates 102, 103 and a substrate (e.g., the substrate 107). The temperature controller 142 and/or the system controller 160 may control flow rate of backside gas (e.g., helium) to the gas channels 115 for cooling the substrate by controlling flow from one or more of the gas sources 132 to the gas channels 115. The temperature controller 142 may also communicate with a coolant assembly 146 to control flow of a first coolant (pressures and flow rates of a cooling fluid) through the channels 116. The first coolant assembly 146 may receive a cooling fluid from a reservoir (not shown). For example, the coolant assembly 146 may include a coolant pump and reservoir. The temperature controller 142 operates the coolant assembly 146 to flow the coolant through the channels 116 to cool the baseplate 103. The temperature controller 142 may control the rate at which the coolant flows and a temperature of the coolant. The temperature controller 142 controls current supplied to the TCEs 110 and pressure and flow rates of gas and/or coolant supplied to channels 115, 116 based on detected parameters from sensors 143 within the processing chamber 104. The temperature sensors 143 may include resistive temperature devices, thermocouples, digital temperature sensors, and/or other suitable temperature sensors (e.g., some of which are shown in FIG. 3 as temperature sensors 290). During an etch process, the substrate 107 may be heated up by a predetermined temperature (e.g., 120 degrees Celsius (° C.)) in presence of high-power plasma. Flow of gas and/or coolant through the channels 115, 116 reduces temperatures of the baseplate 103, which reduces temperatures of the substrate 107 (e.g., cooling from 120° C. to 80° C.).

A valve 156 and pump 158 may be used to evacuate reactants from the processing chamber 104. The system controller 160 may control components of the substrate processing system 100 including controlling supplied RF power levels, pressures and flow rates of supplied gases, RF matching, etc. The system controller 160 controls states of the valve 156 and the pump 158. A robot 170 may be used to deliver substrates onto, and remove substrates from, the ESC 101. For example, the robot 170 may transfer substrates between the ESC 101 and a load lock 172. The robot 170 may be controlled by the system controller 160. The system controller 160 may control operation of the load lock 172.

A power source 180 may provide power, including a high voltage) to electrodes 182 to electrostatically clamp a substrate to the top plate 102. The power source 180 may be controlled by the system controller 160.

The valves, gas and/or coolant pumps, power sources, RF generators, etc. may be referred to as actuators. The TCEs, gas channels, coolant channels, etc. may be referred to as temperature adjusting elements.

Referring now also to FIG. 2, which shows a portion 200 of an ESC including a top plate 202, an intermediate layer 204, and a baseplate (or bottom plate) 206. The top plate 202 is bonded to the baseplate 206 via the intermediate layer 204. As shown, the baseplate 206 may have a protective coating (or uppermost layer) 208. As described above, the plates 202, 206 may be formed of ceramic and the protective coating 208 may be formed of AlN, yttria (Y2O3), zirconia (ZrO2). By forming both of the plates 202, 206 and the protective coating 208 with ceramic and/or the same material, differences between coefficients of thermal expansion of the plates 202, 206 and the protective coating 208 are minimized. This minimizes and/or eliminates high-voltage breakdown and/or cracking of the protective coating 208. In other words, the corresponding standoff voltage is increased.

In the example shown, the top plate 202 includes electrostatic clamping electrodes 210, which may receive power from the power source 180. The electrostatic clamping electrodes 210 may be connected to terminals, which may be connected to the power source 180. An example insulated tower (sometime referred to as a "column") including a terminal for an electrostatic clamping electrode is shown in FIG. 3.

The baseplate 206 includes radio frequency (RF) electrodes 212. The RF electrodes 212 may receive power from terminals 214, which may be connected to the bias RF matching network 129. The terminals 214 are disposed in insulated towers 216 that extend from a bottom of the baseplate 206 to the RF electrodes 212. The RF electrodes 212 may be disposed near and/or within predetermined distances of top surfaces of the baseplate 206. The RF electrodes 212 may be disposed in different patterns radially across the baseplate 206. The corresponding terminals may also be disposed in various patterns. As an example, the terminals may be equally spaced apart from each other, disposed at equal radial distances from a center of a corresponding ESC, and disposed at points along one or more circles.

The RF electrodes 212 and other RF electrodes disclosed herein, which may be disposed in a top plate, a baseplate and/or an edge ring, may be independently controlled (i.e. receive power independent of each other) or controlled in groups (i.e. two or more RF electrodes receiving power during a same period of time and from a same power source). When independently controlled, the RF electrodes may be activated and deactivated at different times and receive different voltages and current levels. When not powered independently, the RF electrodes that are in a same group may be activated at the same time, deactivated at the same time, and receive the same voltage and current levels. Groups of RF electrodes may be controlled independently. The stated pattern and control of the RF electrodes provides increased control over temperatures across top surfaces of an ESC and thus temperatures of a substrate during processing of the substrate, and provide increased control over RF power and voltage across the top surfaces of the ESC and substrate, therefore providing increased control of an etching and/or deposition process.

One or more of the RF electrodes 212 (212a) may be disposed in a portion 218 that protrudes upward from a base layer 219 of the baseplate 206. The baseplate 206 may include the protective coating 208 and the base layer 219. The baseplate 206 may have one or more flat top surfaces and include one or more steps. In the example shown, the baseplate 206 has a single step down from the portion 218 to the base layer 219. The portion 218 has an uppermost (or top) surface 221 and the base layer 219 has an uppermost (or top) surface 223 at a flange 225. Roughness of the surfaces 221, 223 may be controlled during formation of the baseplate 206 to further control thermal energy transfer, for example, between the top plate 202 and the baseplate 206. The portion 218 has a smaller outer diameter than an outer diameter of the base layer 219 and is smaller than an outer diameter of the top plate 202. The top plate 202 has a smaller outer diameter than the outer diameter of the baseplate 206. The stated diameters may vary depending on the application and corresponding component configurations.

Figure 7:
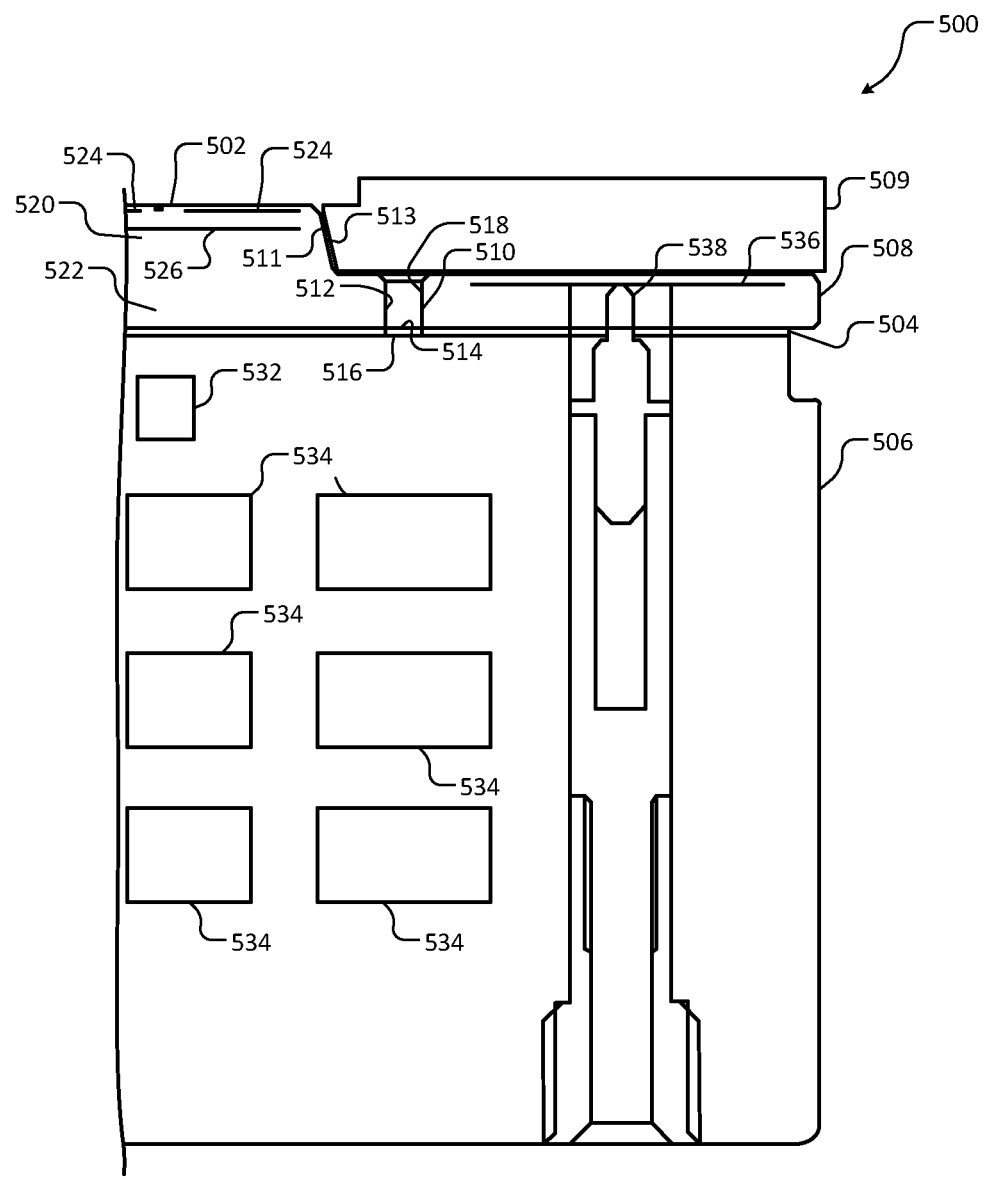
FIG. 7 is a cross-sectional side view of an example of a portion of an ESC including an edge ring and illustrating a terminal of a radio frequency (RF) electrode of the edge ring in accordance with an embodiment of the present disclosure.

One or more of the RF electrodes 212 (212b) may be disposed near an outer periphery of the base layer 219, as shown. The electrode 212b may be disposed below an edge ring centered on the portion 218 and in the base layer 219. The portion 218 may be shaped (e.g., conical-shaped or a variant of conical-shaped) to center other chamber components (e.g., a second edge ring) on the baseplate 206 and minimize gaps between the other chamber components and the portion 218. An example of the second edge ring is shown in FIG. 7.

One or more of the RF electrodes 212 (212c) may be disposed in the base layer 219, not in the portion 218 and extend radially from a point radially inward of an outer periphery of the portion 218 to a point radially inward of an outer periphery of the base layer 219. The base layer 219 may include multiple layers. Each of the layers may have corresponding coolant channels and/or gas channels. The RF electrodes 212 and/or other electrodes disclosed herein may be formed of, for example, Tungsten (W), Platinum (Pt), Silver (Ag), Palladium (Pd) and/or other conductive materials.

In order to provide a baseplate with adequate strength and durability and include embedded channels as disclosed herein with efficient heat transfer characteristics, the baseplate 206 may be formed from ceramic compound layers stacked and sintered together to form a unitary structure. Each of the ceramic compound layers includes a mixture of ceramic and a bonding material. As an example, sheets of thin (e.g., 1 millimeter (mm) thick) ceramic compound material and bonding layers may be stacked. The ceramic compound layers may be patterned, such that when stacked form the gas channels 220 and the coolant channels 222. The resulting stack is then baked in a furnace at a predetermined temperature for a predetermined period of time to allow the ceramic particles of the ceramic compound layers to sinter together and for the bonding layers and/or other adhesive materials to burn off. The resultant baseplate is then removed from the furnace.

Figure 4:
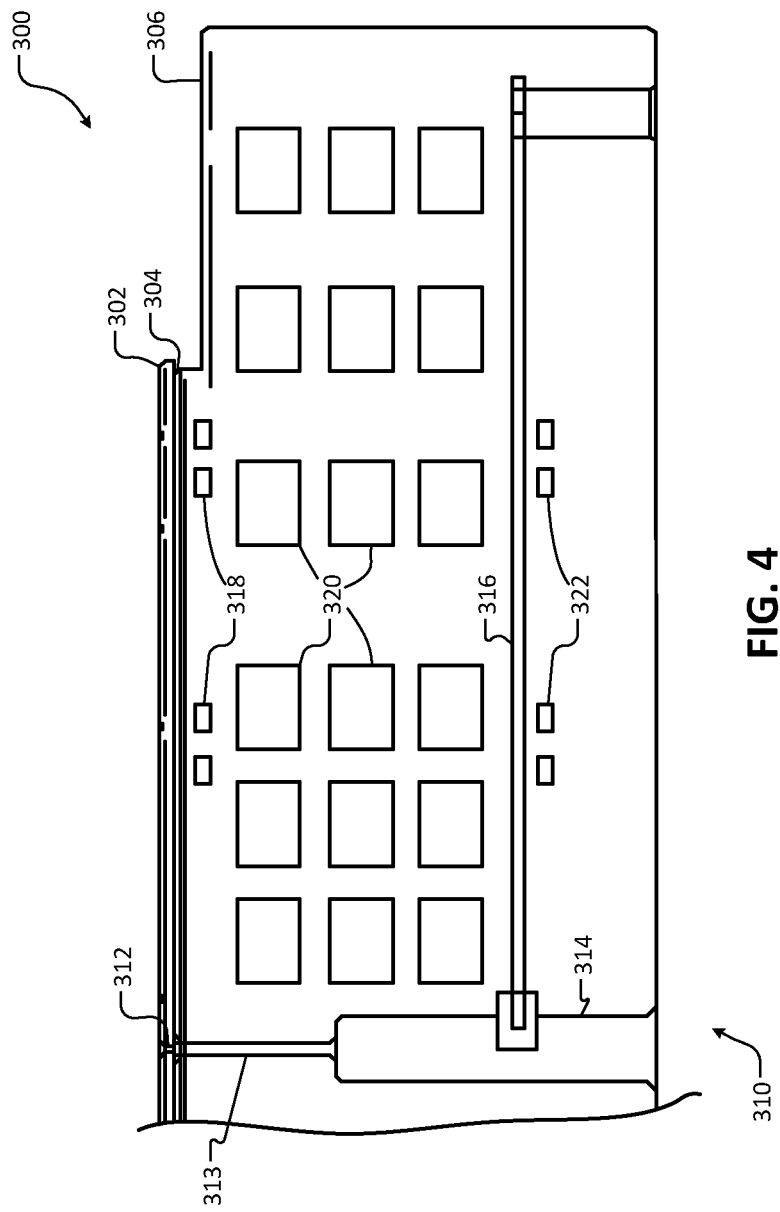
FIG. 4 is a cross-sectional side view of an example of a portion of an ESC illustrating a lift pin arrangement in accordance with an embodiment of the present disclosure.

The baseplate 206 also includes gas channels 220 and coolant channels 222. The gas channels 220 may receive gas from the manifold 140. The gas channels 220 may be disposed on a same radially extending plane and/or in a same one or more layers of the baseplate 206, as shown. As an alternative, the gas channels 220 may be disposed on multiple radially extending planes and/or in different layers of the baseplate 206. The gas channels 220 may be used to provide a backside gas to a backside of a substrate. This is further shown in FIG. 3 and FIG. 4. An example arrangement of multiple layers of gas channels is shown in FIG. 4.

Figure 6:
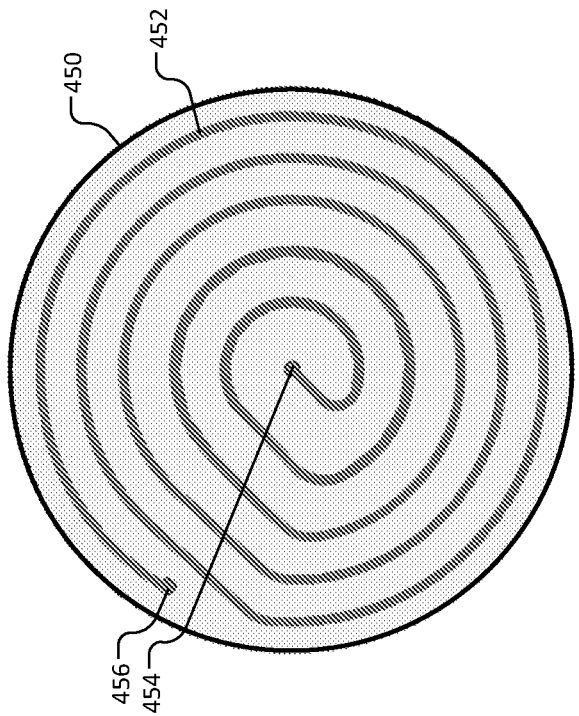
FIG. 6 is a top cross-sectional view of an example of a coolant channel layer of an ESC in accordance with an embodiment of the present disclosure.
Figure 5:
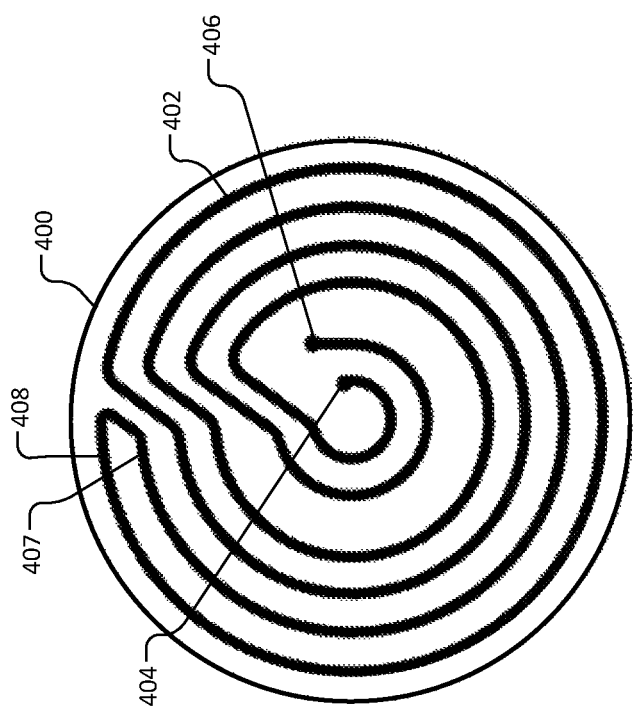
FIG. 5 is a top cross-sectional view of an example of a coolant channel layer of an ESC in accordance with an embodiment of the present disclosure.

The coolant channels 222 may be disposed on multiple radially extending planes and/or in different layers of the baseplate 206, as shown. As an alternative, the coolant channels 222 may be disposed on a same radially extending plane or in a same one or more layers of the baseplate 206. Each layer of the coolant channels 222 (three layers are shown) may include a coolant channel in a bifillar arrangement or a single fillar arrangement, examples of which are shown in FIGS. 5 and 6. Although shown in a particular arrangement, the channels 220, 222 may be in other arrangements. Gas channels and/or coolant channels may be included in any layer of the baseplate 206.

FIG. 3 shows a portion 250 of an ESC including a top plate 252, an intermediate layer 254, and a baseplate 256. The top plate 252 is bonded to the baseplate 256 via the intermediate layer 254. An annular seal 257 may be (i) disposed between an outer periphery of the top plate 252 and a top of a base layer 259 of the baseplate 256, and (ii) covers an outer edge 261 of the intermediate layer 254.

The top plate 252 includes electrostatic clamping electrodes 258 and gas outlets 260. The gas outlets 260 receive a backside gas from, for example, one or more gas channels (one gas channel 262 is shown). One or more of the gas channels may each include one or more porous mediums or plugs (e.g., porous plugs 264). The porous mediums and/or plugs may be co-fired with the ceramic plates. In one embodiment, the gas channels do not include porous plugs. The porous plugs include small pores and perform as medium buffers to prevent formation of plasma in the gas channels. In the example shown, a first porous plug 264a is at a first end of the gas channel 262 and extends from an area within the baseplate 256 and/or within a portion 266 of the baseplate 256, through the intermediate layer 254 to an area within the top plate 252. A second porous plug 264b is at a second end of the gas channel 262 and is disposed at a bottom of the baseplate 256.

The baseplate 256 may include gas channels 270 and coolant channels 272 as described above. Each of the coolant channels 272 is connected to an input tower and an outlet tower within the baseplate 256. An example tower 274 is shown.

The baseplate 256 may include a tower 280 having a terminal (not shown) connected to one of the electrostatic clamping electrodes 258. The baseplate 256 may further include one or more temperatures sensors. Example temperature sensors 290 are shown and are attached to respective towers 292. The temperature sensors may provide output signals to the controllers 142, 160. A first temperature sensor 290a is shown for detecting a temperature within the top plate 252. A second temperature sensor 290b is shown for detecting a temperature within the base layer 259. A third temperature 290c is shown for detecting a temperature near a periphery of the baseplate 256 below an RF electrode 294. Any number of temperature sensors may be included in the plates 252, 256.

FIG. 4 shows a portion 300 of an ESC that includes a top plate 302, an intermediate layer 304, and a baseplate 306. As an example, the baseplate 306 includes a lift pin assembly 310, which includes a lift pin 312, a lift pin channel 313, and a gas channel 316. Any number of lift pin assemblies may be included in the ESCs disclosed herein. The baseplate 306 may include one or more layers of gas channels. The gas channels may be located above or below the coolant channels. As an example, a first set of gas channels 318 are shown above coolant channels 320 and a second set of gas channels 322 are shown below the coolant channels 320.

FIG. 5 shows a coolant channel layer 400 of an ESC. The coolant channel layer 400 includes a coolant channel 402 that is in a bifillar arrangement. The coolant channel 402 includes an inlet 404 and an outlet 406, which are centrally located in the coolant channel layer 400. The coolant channel 402 includes a first portion 407 and a second portion 408. The first portion 407 starts near a center of the coolant channel layer 400 wraps in a circular coil like pattern until reaching a periphery of the coolant channel layer 400. The second portion 408 extends from the first portion 107 and along the first portion 107 from the periphery of the coolant channel layer 400 back to a point near the center of the coolant channel layer 400. Tubular-shaped sections or all of the portions 407, 408 may extend in a parallel arrangement.

FIG. 6 shows a coolant channel layer 450 of an ESC. The coolant channel layer 450 includes a coolant channel 452 that is in a single fillar arrangement. The coolant channel 452 includes an inlet 454 that is centrally located and an outlet 456, which may be located near a periphery of the coolant channel layer 450.

A couple of example coolant channel arrangements are shown in FIGS. 5-6. The ESCs disclosed herein may include other types of coolant channel arrangements. For example, the ESCs may have a coolant channel arrangement having an azimuthally symmetric center to edge type flow of coolant.

FIG. 7 shows a portion 500 of an ESC including a top plate 502, an intermediate layer 504, a baseplate 506, a first annular-shaped edge ring 508 and a second annular-shaped edge ring 509. The intermediate layer 504 may be disposed (i) between the plates 502, 506, and (ii) between the edge ring 508 and the baseplate 506. The intermediate layer 504 may be formed of one or more materials having high thermal conductivity (e.g., 0.5-4.0 watts per meter Kelvin (W/mK)).

The first annular-shaped edge ring 508 is centered to the top plate 502 and centered on the base plate 506. The top plate 502 may be shaped (e.g., conical-shaped or a variant of conical-shaped) to center the second annular-shaped edge ring 509 and minimize gaps between the second annular-shaped edge ring 509 and the top plate 502. An inner radial side 511 of the second annular-shaped edge ring 509 may be shaped to match an outer radial edge 513 of the top plate 502. The first annular-shaped edge ring 508 may be formed of ceramic and include one or more electrodes, implemented as RF electrodes and/or heating elements. The second annular-shaped edge ring 509 may be formed of, for example, silicon and/or other suitable materials and protects at least a portion of the first annular-shaped edge ring 508 from exposure to plasma.

An annular-shaped gap 510 may be disposed between the top plate 502 and the first annular-shaped edge ring 508. In one embodiment, an elastomer seal (e.g. an o-ring) may be disposed in the gap 510 and be in contact with a peripheral face 512 of the top plate 502, a top surface 514 of the intermediate layer 504 or a top surface 516 of the baseplate 506, and an inner radially facing face 518 of the edge ring 508. The top plate 502 may have a top portion 520 that protrudes upward from a bottom portion 522 of the top plate 502. The top portion 520 may include electrostatic clamping electrodes 524 and RF electrodes (one RF electrode 526 is shown). The baseplate 506 may include gas channels (one gas channel 532 is shown) and coolant channels 534. Some of the coolant channels 534 may be partially or entirely disposed in the baseplate 506 under the edge ring 508 for cooling the edge ring 508.

The edge ring 508 may include one or more electrodes (one electrode 536 is shown). An example terminal 538 is shown and provides power to the electrode 536. The terminals disclosed herein may be of various types, as an example, the terminals may be pogo pins. The terminals are configured to provide a connection to a corresponding electrode. The electrode 536 may be a RF electrode or an electrostatic clamping electrode. The edge ring 508 may have any number of RF and/or electrostatic clamping electrodes.

Figure 8:
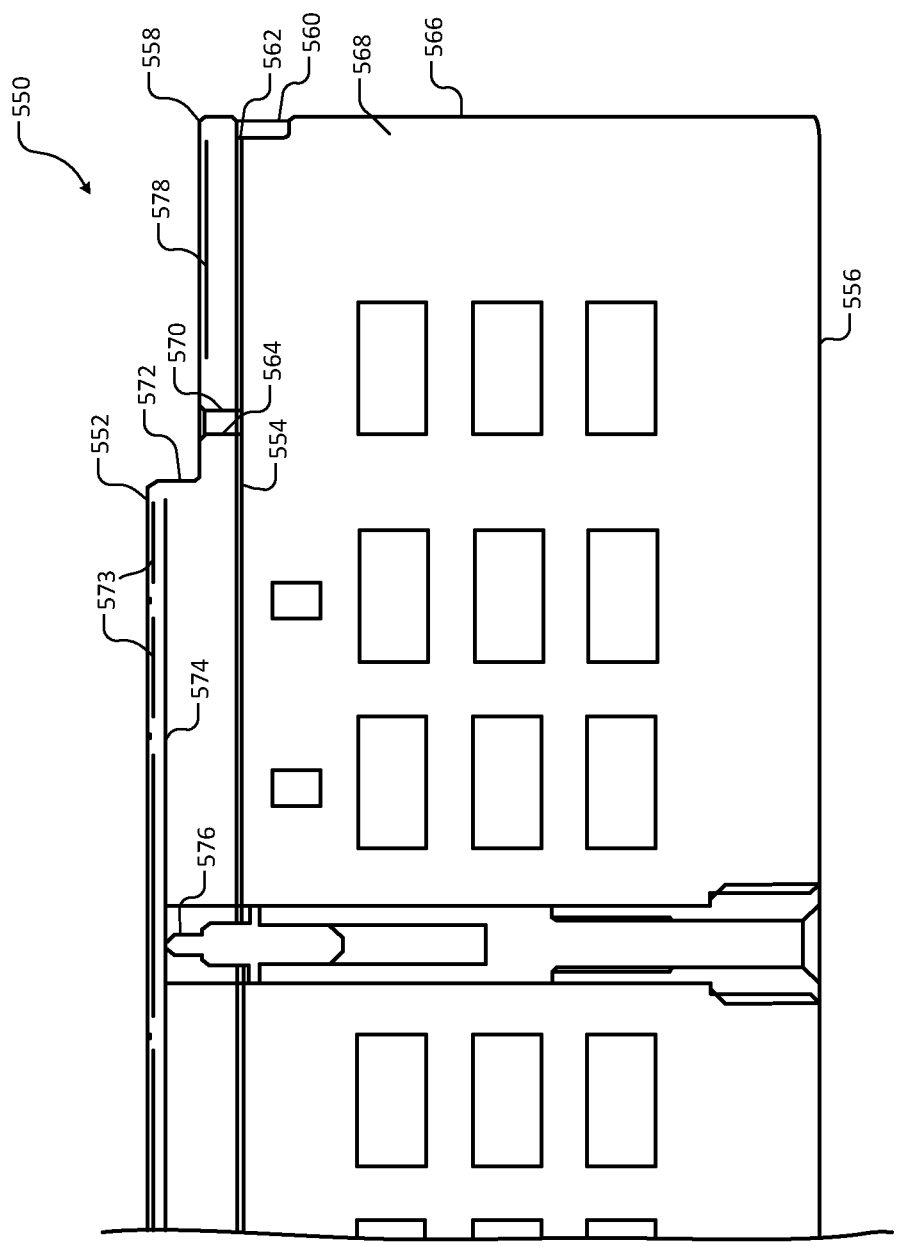
FIG. 8 is a cross-sectional side view of an example of a portion of an ESC illustrating a terminal of a RF electrode of a top plate of the ESC, or gap between the top plate and an edge ring, and a seal for an intermediate layer and a peripheral arrangement of a baseplate in accordance with an embodiment of the present disclosure.

FIG. 8 shows a portion 550 of an ESC that includes a top plate 552, an intermediate layer 554, a baseplate 556 and an edge ring 558. The ESC may include a seal 560 that is disposed in a peripheral edge 562 of the intermediate layer 554 and between a peripheral end 564 of the top plate 552 and a peripheral end 566 of a bottom portion 568 of the baseplate 556.

An annular-shaped gap 570 may be disposed between the top plate 552 and the edge ring 558. An elastomer seal (e.g., an o-ring) may be disposed in the gap 570. A top protruding portion 572 of the top plate 552 may include electrostatic clamping electrodes 573 and one or more RF electrodes 574. The one or more RF electrodes 574 may receive power from a terminal 576. The edge ring 558 may include an electrode 578, which may be a RF electrode or an electrostatic clamping electrode.

Figure 9:
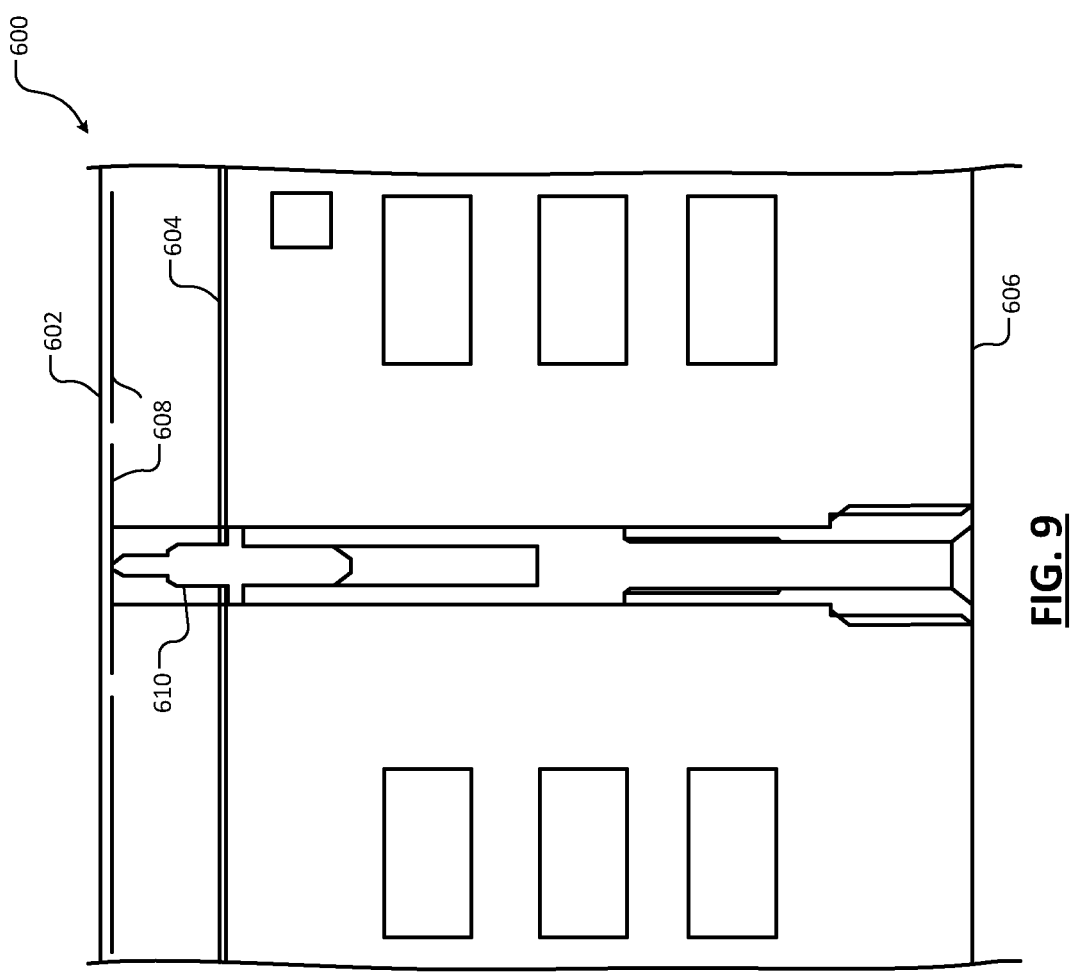
FIG. 9 is a cross-sectional view of an example of a portion of an ESC illustrating a terminal of a direct current (DC) electrode of a top plate of the ESC in accordance with an embodiment of the present disclosure.

FIG. 9 shows a portion 600 of an ESC that includes a top plate 602, an intermediate layer 604 and a baseplate 606. The top plate 602 includes one or more DC electrodes 608. The DC electrodes 608 may receive power from a power source (e.g., the power source 180 of FIG. 1) via a terminal, such as terminal 610.

Figure 10:
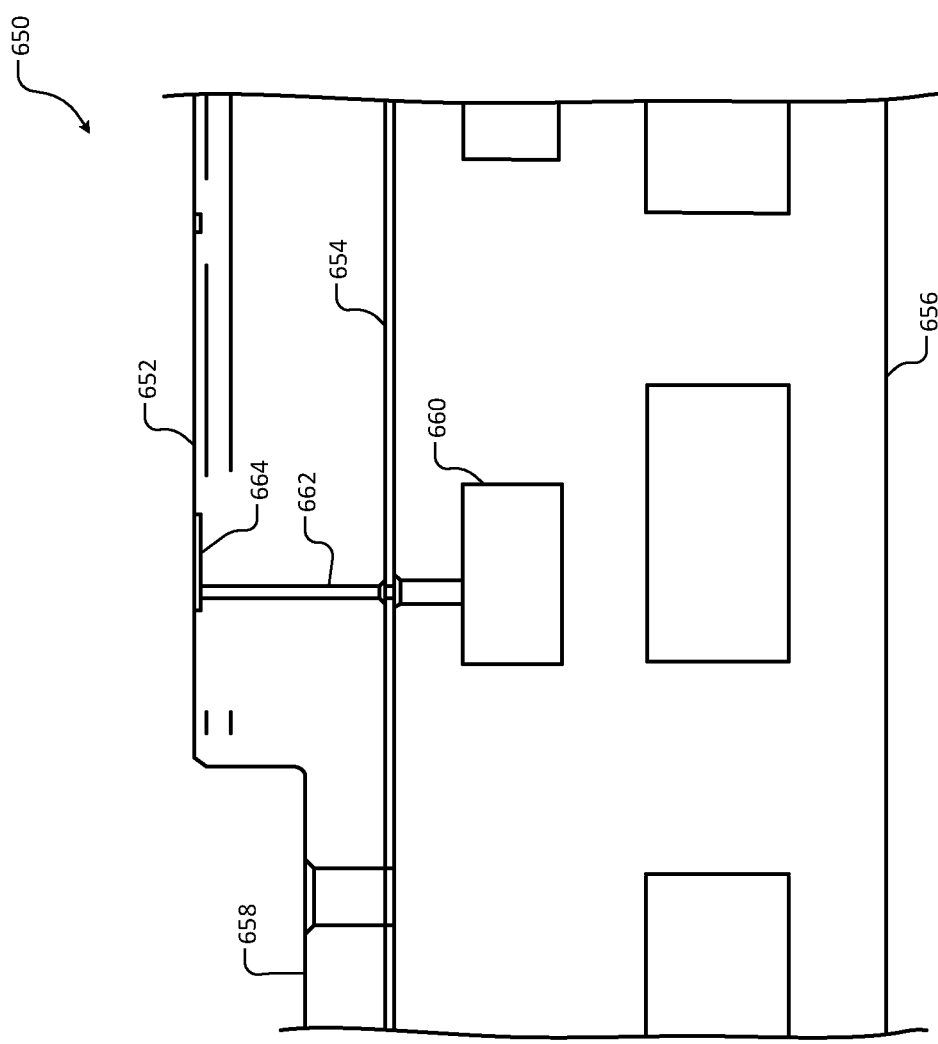
FIG. 10 is a cross-sectional view of an example of a portion of an ESC illustrating a gas channel without a porous plug in accordance with an embodiment of the present disclosure; and In the drawings, reference numbers may be reused to identify similar and/or identical elements.

FIG. 10 shows a portion 650 of an ESC that includes a top plate 652, an intermediate layer 654, a baseplate 656, and an edge ring 658. The baseplate 656 includes a gas channel 660 that directs a backside gas into a gas channel 662, which extends upwards from the gas channel 660 through the intermediate layer 654 and the top plate 652 to an outlet 664. The gas channel 662 provides an example of a gas channel that does not include a porous plug.

The above-disclosed examples include baseplates formed of ceramic and not metal. This can eliminate high-voltage breakdown and/or cracking of coating layers on the baseplates. The plates of the disclosed ESCs include various electrode, gas channel and coolant channel configurations with electrodes and channels embedded in various areas and layers of the plates for improved RF and temperature control in the ESCs, substrates and surrounding areas and components of substrate processing chambers. Since the baseplates of the ESCs are formed of ceramic, the baseplates are able to include any number of electrodes, such as RF electrodes for increased RF control across a substrate. Also, since ceramic has low thermal conductivity as compared to metal, and/or manufacturing process limitation of ceramic material lamination and sintering, the baseplates are disclosed as having multiple layers of coolant channels to increase cooling contact surface area.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An electrostatic chuck for a substrate processing system, the electrostatic chuck comprising:
 a top plate configured to electrostatically clamp to a substrate and formed of ceramic;
 an intermediate layer disposed below the top plate; and
 a baseplate distinct from the top plate and disposed below the intermediate layer and formed of ceramic,
 wherein
 the intermediate layer bonds the top plate to the baseplate,
 the baseplate comprises a plurality of radio frequency (RF) electrodes,
 the plurality of RF electrodes are not connected to each other, independently controlled, and configured for RF plasma generation, the baseplate comprises one or more gas channels, a first portion, and a second portion, the first portion protrudes upward from the second portion and has a smaller diameter than an outer diameter of the baseplate and an outer diameter of the top plate, the top plate has a smaller outer diameter than the outer diameter of the baseplate, and one or more of the plurality of RF electrodes is embedded in the first portion of the baseplate above the one or more gas channels.

2. The electrostatic chuck of claim 1, wherein a ceramic purity level of the baseplate is greater than or equal to 90%.

3. The electrostatic chuck of claim 1, wherein a ceramic purity level of the baseplate is greater than or equal to 95%.

4. The electrostatic chuck of claim 1, wherein a ceramic purity level of the baseplate is greater than or equal to 99.9%.

5. The electrostatic chuck of claim 1, wherein:
the baseplate comprises
a base layer, and
a protective coating layer disposed on the base layer; and
the protective coating layer is disposed between the base layer and the intermediate layer.

6. The electrostatic chuck of claim 5, wherein the protective coating layer is formed of ceramic.

7. The electrostatic chuck of claim 1, wherein the intermediate layer and the top plate are disposed on the first portion.

8. The electrostatic chuck of claim 1, wherein the one or more gas channels are disposed below the top plate.

9. The electrostatic chuck of claim 1, wherein:
the baseplate comprises a first layer and a second layer;
the first layer is disposed above the second layer;
the first layer comprises a first set of gas channels including the one or more gas channels; and
the second layer comprises a second set of gas channels.

10. The electrostatic chuck of claim 1, further comprising an edge ring disposed on the baseplate and at least partially disposed radially outward of the top plate, wherein:
the baseplate comprises a protruding portion that extends upward towards the top plate; and
the protruding portion centers the edge ring on the baseplate.

11. The electrostatic chuck of claim 10, wherein one or more of the plurality of RF electrodes is disposed in the baseplate below the edge ring.

12. The electrostatic chuck of claim 1, further comprising an edge ring disposed on the baseplate and centered on and radially outward of the top plate.

13. The electrostatic chuck of claim 1, further comprising an edge ring disposed on the baseplate and at least partially disposed radially outward of the top plate, wherein the edge ring comprises a radio frequency electrode or an electrostatic clamping electrode.

14. The electrostatic chuck of claim 1, wherein the top plate comprises one or more electrostatic clamping electrodes.

15. The electrostatic chuck of claim 1, wherein the top plate comprises one or more heating elements.

16. The electrostatic chuck of claim 1, wherein the baseplate comprises one or more direct current electrodes.

17. The electrostatic chuck of claim 1, wherein the baseplate comprises a plurality of coolant channels.

18. The electrostatic chuck of claim 17, wherein at least one of the plurality of coolant channels are in a bifillar arrangement.

19. The electrostatic chuck of claim 18, wherein one of the plurality of coolant channels starts at a first point near a center of the baseplate, wraps in a circular coil like pattern to a periphery of the baseplate, and extends from the periphery of the baseplate in a coil like pattern back to a second point near the center of the baseplate.

20. The electrostatic chuck of claim 17, wherein at least one of the plurality of coolant channels are in a single fillar arrangement.

21. The electrostatic chuck of claim 17, wherein:
the baseplate comprises a first layer and a second layer;
the plurality of coolant channels comprise a first set of coolant channels and a second set of coolant channels;
the first layer includes the first set of coolant channels; and
the second layer includes the second set of coolant channels.

22. The electrostatic chuck of claim 1, further comprising a gas channel extending from a bottom portion of the baseplate to an outlet in the top plate, wherein the gas channel comprises at least one porous medium.

23. The electrostatic chuck of claim 1, further comprising:
an edge ring disposed on the baseplate and at least partially disposed radially outward of the top plate,
wherein the baseplate comprises a protruding portion that extends upward towards the top plate and the protruding portion centers the edge ring on the baseplate; and
a single annular-shaped seal disposed
radially outward of and providing protection for a radial outer edge of the intermediate layer, and
between and in contact with the edge ring and the baseplate.

24. The electrostatic chuck of claim 23, wherein the annular-shaped seal covers the radial outer edge of the intermediate layer.

25. The electrostatic chuck of claim 1, wherein the baseplate is formed entirely of at least one of ceramic, a non-metallic material, or a non-conductive material.

26. The electrostatic chuck of claim 1, wherein the plurality of RF electrodes are disposed in an upward protruding portion of the baseplate.

27. The electrostatic chuck of claim 1, wherein:
the baseplate comprises a first portion and a second portion;
the first portion protrudes upward from the second portion; and
the one or more gas channels are disposed at least partially in the first portion.

28. The electrostatic chuck of claim 27, wherein the second portion comprises one or more liquid coolant channels disposed below the one or more gas channels.

29. The electrostatic chuck of claim 1, wherein:
the plurality of RF electrodes and the one or more gas channels are disposed in an upward protruding portion of the baseplate; and
the baseplate comprises one or more liquid coolant channels disposed below the one or more gas channels.

30. The electrostatic chuck of claim 1, wherein:
the baseplate comprises a plurality of insulated towers comprising respectively a plurality of terminals; and
the plurality of RF electrodes receive power respectively from the plurality of terminals.

31. An electrostatic chuck for a substrate processing system, the electrostatic chuck comprising:
a top plate configured to electrostatically clamp to a substrate and formed of ceramic;
an intermediate layer disposed below the top plate; and a baseplate distinct from the top plate and disposed below the intermediate layer and formed of ceramic, wherein
the baseplate comprises a plurality of radio frequency (RF) electrodes,
the plurality of RF electrodes are not connected to each other, independently controlled, and configured for RF plasma generation,
the intermediate layer bonds the top plate to the baseplate,
the baseplate comprises a first portion and a second portion,
the first portion protrudes upward from the second portion and has a smaller diameter than an outer diameter of the baseplate and an outer diameter of the top plate,
the top plate has a smaller outer diameter than the outer diameter of the baseplate, and
one or more of the plurality of RF electrodes is disposed in the baseplate radially outward of the first portion.

32. The electrostatic chuck of claim 31, wherein the baseplate comprises one or more gas channels disposed at least partially in the first portion.

33. The electrostatic chuck of claim 32, wherein the baseplate comprises one or more coolant channels disposed in the second portion.

34. The electrostatic chuck of claim 33, wherein the one or more coolant channels circulate a liquid coolant.

35. The electrostatic chuck of claim 31, wherein two or more of the plurality of RF electrodes are embedded in the baseplate radially outward of the first portion.

36. The electrostatic chuck of claim 31, wherein the one or more RF electrodes are, in addition to being disposed in the baseplate radially outward of the first portion are not disposed below the top plate.

37. The electrostatic chuck of claim 31, wherein:
the baseplate comprises a plurality of insulated towers comprising respectively a plurality of terminals; and
the plurality of RF electrodes receive power respectively from the plurality of terminals.

38. A substrate processing system comprising:
a processing chamber;
an electrostatic chuck disposed in the processing chamber, wherein the electrostatic chuck includes
a top plate configured to electrostatically clamp to a substrate and formed of ceramic,
an intermediate layer disposed below the top plate,
a baseplate distinct from the top plate and disposed below the intermediate layer and formed of ceramic, wherein the baseplate comprises a first portion and a second portion, the first portion protrudes upward from the second portion and has a smaller diameter than an outer diameter of the baseplate and an outer diameter of the top plate, and wherein the top plate has a smaller outer diameter than the outer diameter of the baseplate, and
one or more temperature adjusting elements;
an edge ring disposed on the baseplate and at least partially disposed radially outward of the top plate;
a radio frequency (RF) electrode disposed in the second portion of the baseplate and below the edge ring, wherein the RF electrode is configured for RF plasma generation;
a temperature sensor disposed in at least one of the top plate or the baseplate and configured to detect a temperature of the top plate; and
a controller configured to receive an output of the temperature sensor, and based on the output of the temperature sensor controls operation of an actuator to adjust temperature of the one or more temperature adjusting elements to adjust a temperature of the at least one of the top plate or the baseplate.

39. The substrate processing system of claim 38, wherein:
the one or more temperature adjusting elements includes at least one of a temperature control element, a gas channel or a coolant channel; and
the actuator is a power source, a coolant pump, a gas pump, or a valve.

40. The substrate processing system of claim 38, wherein the temperature sensor is disposed in the baseplate and configured to detect a temperature of the baseplate.

41. The substrate processing system of claim 38, wherein:
the temperature sensor is disposed in the baseplate and is configured to detect a temperature of an area of the baseplate; and
the area of the baseplate is below the edge ring.

42. The electrostatic chuck of claim 38, wherein:
the baseplate comprises a plurality of RF electrodes;
the plurality of RF electrodes includes the RF electrode disposed in the baseplate and below the edge ring; and
the plurality of RF electrodes are disposed radially outward of the top plate.

43. The electrostatic chuck of claim 38, wherein:
the baseplate comprises a plurality of RF electrodes including the RF electrode disposed in the baseplate below the edge ring; and
the plurality of RF electrodes are disposed in the baseplate below the edge ring and not below the top plate.

44. The electrostatic chuck of claim 38, wherein the edge ring is disposed radially outward of a top surface of the top plate.

45. The electrostatic chuck of claim 38, wherein:
the baseplate comprises coolant channels and gas channels, the gas channels are disposed above the coolant channels; and
the RF electrode is disposed radially outward of the gas channels and above the coolant channels.

* * * * *